United States Patent
Kuhn et al.

(10) Patent No.: US 12,000,871 B2
(45) Date of Patent: Jun. 4, 2024

(54) CIRCUIT ENERGIZATION STATUS TEST DEVICE AND METHOD

(71) Applicant: Klein Tools, Inc., Lincolnshire, IL (US)

(72) Inventors: Bruce R. Kuhn, Naperville, IL (US); Christian A. Castro, Deerfield, IL (US)

(73) Assignee: Klein Tools, Inc., Lincolnshire, IL (US)

( * ) Notice: Subject to any disclaimer, the term of this patent is extended or adjusted under 35 U.S.C. 154(b) by 335 days.

(21) Appl. No.: 17/426,865

(22) PCT Filed: Jan. 29, 2019

(86) PCT No.: PCT/US2019/015620
§ 371 (c)(1),
(2) Date: Jul. 29, 2021

(87) PCT Pub. No.: WO2020/159480
PCT Pub. Date: Aug. 6, 2020

(65) Prior Publication Data
US 2022/0107343 A1    Apr. 7, 2022

(51) Int. Cl.
*G01R 19/15* (2006.01)
*G01R 15/14* (2006.01)
*G08B 3/10* (2006.01)
*G08B 21/18* (2006.01)

(52) U.S. Cl.
CPC .......... *G01R 19/15* (2013.01); *G01R 15/146* (2013.01); *G08B 3/10* (2013.01); *G08B 21/18* (2013.01)

(58) Field of Classification Search
CPC ...... G01R 19/15; G01R 19/146; G08B 21/18; G08B 3/10
See application file for complete search history.

(56) References Cited

U.S. PATENT DOCUMENTS

| | | | |
|---|---|---|---|
| 6,043,640 A | * | 3/2000 | Lauby .......... G01R 15/125 336/175 |
| 8,179,145 B2 | | 5/2012 | Kinsel |
| 9,671,466 B2 | | 6/2017 | Murahari et al. |

(Continued)

FOREIGN PATENT DOCUMENTS

WO    WO 01/86683 A1    11/2001

OTHER PUBLICATIONS

European Patent Office, International Search Report in International Patent Application No. PCT/US2019/015620, 5 pp. (dated Nov. 11, 2019).

(Continued)

*Primary Examiner* — Dominic E Hawkins

(57) ABSTRACT

Disclosed herein are devices (100), systems, and methods for testing a circuit (114). A circuit test device (100) includes a housing (102) and a circuit (104) disposed in the housing (102). The circuit (104) includes an electromagnetic field (EMF) sensor (106) and a signal detector (110) coupled to the EMF sensor (106). The circuit test device (100) includes an interface (112) connected to the circuit (104) and extending through the housing (102). The interface (112) is adapted for coupling the circuit (104) to a circuit under test (CUT) (114). The EMF sensor (106) is configured to generate a signal in the presence of a time varying flow of current from the CUT (114) in the circuit (104). The EMF sensor (106) is configured to provide the signal to the signal detector (110).

20 Claims, 3 Drawing Sheets

(56) References Cited

U.S. PATENT DOCUMENTS

| | | | |
|---|---|---|---|
| 10,001,521 B1* | 6/2018 | Tsironis | G01R 1/045 |
| 10,530,977 B2* | 1/2020 | Kearsley | H04N 23/51 |
| 2002/0039026 A1 | 4/2002 | Stroth et al. | |
| 2004/0174308 A1 | 9/2004 | Chang | |
| 2009/0248329 A1* | 10/2009 | Restrepo | G01R 31/1272 |
| | | | 324/509 |
| 2014/0184260 A1* | 7/2014 | Russell | G01R 1/06788 |
| | | | 324/755.01 |
| 2018/0164350 A1* | 6/2018 | Thompson | G01R 15/16 |

OTHER PUBLICATIONS

European Patent Office, Written Opinion in International Patent Application No. PCT/US2019/015620, 8 pp. (dated Nov. 11, 2019).

\* cited by examiner

US 12,000,871 B2

CIRCUIT ENERGIZATION STATUS TEST DEVICE AND METHOD

TECHNICAL FIELD

The present disclosure relates to electrical test equipment and methods for electric circuits and, more particularly, to systems and methods for testing the energization status of a circuit.

BACKGROUND

In at least some known circuit test devices, detecting a time varying current on a line in a single-phase or multi-phase circuit system while contacting the line requires that two or more of the connections must be intact. In known circuit test devices, a ground line and/or a neutral line is required to be present in order to determine if an energized line is present. With known circuit test devices, a hot wire could be present in circuit that does not contain a ground or neutral line. Such known testers may return a "no power" condition to a user, and thus presenting a safety risk to that user when working on that circuit. To provide flexibility in practice to determine energization status of lines in either single phase or multi-phase circuits, it would be beneficial to provide circuit test devices and methods capable of determining presence of time varying current in any line without requiring that ground and/or neutral lines be present.

SUMMARY OF THE DISCLOSURE

In one aspect, the disclosure describes a circuit test device. The circuit test device includes a housing and a circuit disposed in the housing. The circuit includes an electromagnetic field (EMF) sensor and a signal detector coupled to the EMF sensor. The circuit test device includes an interface connected to the circuit and extending through the housing. The interface is adapted for coupling the circuit to a circuit under test (CUT). The EMF sensor is configured to generate a signal in the presence of a time varying flow of current from the CUT in the circuit, and provide the signal to the signal detector.

In another aspect, the disclosure describes a circuit for testing a circuit under test (CUT). The circuit includes an electromagnetic field (EMF) sensor and a signal detector coupled to the EMF sensor. The circuit includes an interface adapted for coupling the circuit to a circuit under test (CUT). The EMF sensor is configured to generate a signal in the presence of a time varying flow of current from the CUT in the circuit, and provide the signal to the signal detector.

In yet another aspect, the disclosure describes a method for testing a circuit. The method includes interfacing a conductor with a circuit under test (CUT). The conductor is positioned proximal an electromagnetic field (EMF) sensor. The method includes inducing a signal in the EMF sensor in response to a time varying flow of current from the CUT to the conductor. The method includes transmitting the induced signal from the EMF sensor to a signal detector. The method includes determining, by the signal detector and based on the induced signal, a presence of the time varying flow of current from the CUT to the conductor.

In still another aspect, the disclosure describes a method for testing a circuit. The method includes interfacing, by an interface, a circuit under test (CUT) with an electromagnetic field (EMF) sensor. The EMF sensor is positioned proximal the interface. The method includes inducing a signal in the EMF sensor in response to a time varying flow of current from the CUT to the interface. The method includes transmitting the induced signal from the EMF sensor to a signal detector. The method includes determining, by the signal detector and based on the induced signal, a presence of the time varying flow of current from the CUT to the interface.

Further and alternative aspects and features of the disclosed principles will be appreciated from the following detailed description and the accompanying drawings. As will be appreciated, the principles related to devices, systems, and methods for testing circuits disclosed herein are capable of being carried out in other and different embodiments, and capable of being modified in various respects. Accordingly, it is to be understood that both the foregoing general description and the following detailed description are exemplary and explanatory only and do not restrict the scope of the appended claims.

DETAILED DESCRIPTION

Reference will now be made in detail to specific embodiments or features, examples of which are illustrated in the accompanying drawings, which are not drawn to scale. Wherever possible, corresponding or similar reference numbers will be used throughout the drawings to refer to the same or corresponding parts. Moreover, references to various elements described herein, are made collectively or individually when there may be more than one element of the same type. However, such references are merely exemplary in nature. It may be noted that any reference to elements in the singular may also be construed to relate to the plural and vice-versa without limiting the scope of the disclosure to the exact number or type of such elements unless set forth explicitly in the appended claims.

Figure 1:
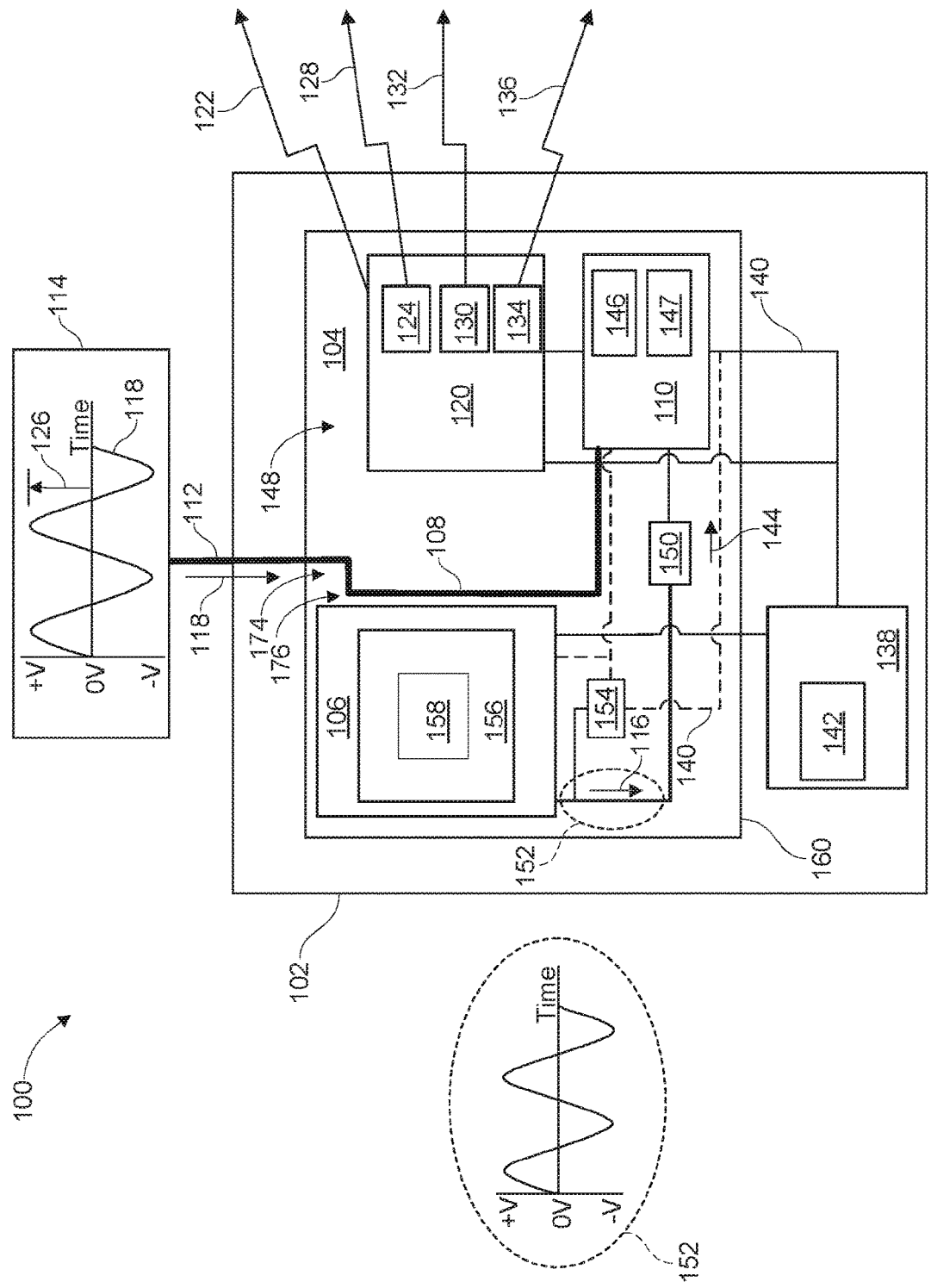
FIG. 1 is a schematic diagram of a circuit test device according to an embodiment of the disclosure.

FIG. 1 is a schematic diagram of a circuit test device (e.g., a circuit test device (100)) according to an embodiment of the disclosure. The circuit test device (100) includes a housing (102) and a circuit (104) disposed in the housing (102). In an example, circuit (104) includes a circuit plate (148). In an example, circuit (104) is or includes a printed circuit board (160). The circuit (104) includes an electromagnetic field (EMF) sensor (106). The circuit (104) includes a conductor (108) positioned proximal the EMF sensor (106). Circuit (104) includes a signal detector (110) coupled to the EMF sensor (106). In an example, the signal detector (110) includes a processor (146), a memory (147), and a microcontroller (not shown in FIG. 1).

In an example, circuit test device (100) includes a power supply (138) disposed in the housing (102) and coupled to the signal detector (110). In the example, the power supply (138) is configured to provide power (140) to the signal detector (110) (e.g., as a direct current (144)). In an example, the power supply (138) includes a battery (142). In an example, the power supply (138) is coupled to EMF sensor (106) and is further configured to transmit a flow of direct current (144) to the EMF sensor (106)

Circuit test device (100) includes an interface (112) connected to the circuit (104) and extending through the housing (102). The interface (112) is adapted for coupling the circuit to a circuit under test (CUT) (114). In an example, circuit test device (100) includes a conductor (108) disposed in the housing (102). In the example, the conductor (108) is coupled to interface (112) and the interface (112) is further adapted for coupling conductor (108) to the CUT (114).

In an example, the EMF sensor (106) is configured to: generate a signal (116) in the presence of a time varying flow of current (118) from the CUT (114) in the circuit (104), and provide the signal (116) to the signal detector (110). In an example, the EMF sensor (106) is positioned proximal interface (112). In one embodiment, the EMF sensor (106) is further positioned in the absence of contact (174) between the interface (112) and the EMF sensor (106). In another embodiment, the EMF sensor (106) is positioned in contact with at least a portion of the interface (112).

In embodiments including the conductor (108), the EMF sensor (106) is further configured to generate the signal (116) in the presence of a time varying flow of current (118) from the CUT (114) in the conductor (108). In an example, the EMF sensor (106) is positioned proximal conductor (108). In one embodiment, the EMF sensor (106) is further positioned in the absence of contact (174) between the conductor (108) and the EMF sensor (106). In another embodiment, the EMF sensor (106) is positioned in contact with at least a portion of the conductor (108).

In an example, the EMF sensor (106) includes an antenna (156). In the example, the antenna (156) includes a conductive pad (158). In an example, circuit (104) includes an amplifier (150) coupled to the EMF sensor (106) and coupled to the signal detector (110). The amplifier (150) is configured to amplify the signal (116) prior to receipt thereof by signal detector (110).

In an example, circuit test device (100) includes a power supply (138) disposed in the housing (102) and coupled to the signal detector (110). In the example, the power supply (138) is configured to provide power (140) to the signal detector (110) (e.g., as a direct current (144)). In an example, the power supply (138) includes a battery (142). In an example, the power supply (138) is coupled to EMF sensor (106) and is further configured to transmit a flow of direct current (144) to the EMF sensor (106). In an example, the power supply (138) is coupled to indicator (120) and is further configured to transmit a flow of direct current to the indicator (120).

The circuit test device (100) includes an indicator (120) coupled to the signal detector (110). The indicator is configured to provide an indication (122) in response to the signal (116). In an example, the indicator (120) includes at least one illuminator (124) coupled to the signal detector (110) and visible externally from the housing (102). In the example, the signal detector (110) is configured to activate the illuminator (124) when the signal (116) is present. In an example, the illuminator (124) is a light emitting diode. In another example, the illuminator (124) is an incandescent bulb.

In an example, the signal (116) includes information indicative of a magnitude (126) of the time varying flow of current (118). In the example, the illuminator (124) is configured to provide variable illumination (128) selectively in at least one of a brightness, a color, and a blinking frequency. In the example, the variable illumination (128) depends on the magnitude (126). In an example, the illuminator (124) provides the illumination (128) when signal (116) is present and does not provide the illumination (128) in the absence of signal (116). In the example, illuminator (124) increases the brightness of illumination (128) in proportion to the magnitude (126). In an example, illuminator (124) provides the illumination (128) at a first color when signal (116) is present (e.g., red) and provides the illumination (128) at a second color in the absence of signal (116) (e.g., green). In an example, illuminator (124) increases the blinking frequency of illumination (128) in proportion to the magnitude (126) or a frequency of the time varying flow of current (118).

In an example, the indicator (120) includes a display (130) coupled to the signal detector (110) and visible externally from the housing (102). In the example, the signal detector (110) is configured to change a display configuration (132) of the display (130) in response to the signal (116). In an example, the signal (116) includes information indicative of the magnitude (126) of the time varying flow of current (118). In the example, the signal detector (110) is further configured to change a display configuration (132) based on the magnitude (126). In an example, the display configuration (132) includes a value of the magnitude (126) (e.g., a root mean square (RMS) voltage value) that a user of circuit test device (100) may view, and which changes with variations in the value of the magnitude (126). In another example, the display configuration (132) includes a at least two symbols (e.g., + and −) that the user may view, and which change from a first symbol displayed on display (130) when the signal (116) is not present (e.g., −) to a second symbol in response to signal (116) being present (e.g., +).

In an example, the indicator (120) includes at least one speaker (134) coupled to the signal detector (110). In the example, the speaker (134) is operable to generate one or more audible sounds (136) in response to the signal (116). In an example, the signal (116) includes information indicative of the magnitude (126) of the time varying flow of current (118). In the example, the one or more audible sounds (136) are adjustable by the signal detector (110) and depend on the magnitude (126). In an example, the speaker (134) generates a first audible sound in the presence of signal (116) (e.g., "live") and generates a second audible sound in the absence of signal (116) (e.g., "not live"). Alternatively, speaker (134) generates an audible sound in the presence of signal (116) (e.g., "live") and generates no other audible sound in the absence of signal (116). In an example, the signal (116) is indicative of a time varying flow of detector current (152).

In an example, the circuit (104) includes a power converter (154) coupled to at least one of: the signal detector (110), the EMF sensor (106), the indicator (120), and the power supply (138). In the example, the power converter (154) is configured to receive at least a portion of the detector current (152) for providing power (140) to at least one of signal detector (110), EMF sensor (106), signal detector (110), and indicator (120). In an example, the power converter (154) is further configured to transmit a flow of direct current (144) to the power supply (138) to, for instance, charge a rechargeable battery (142).

Figure 2:
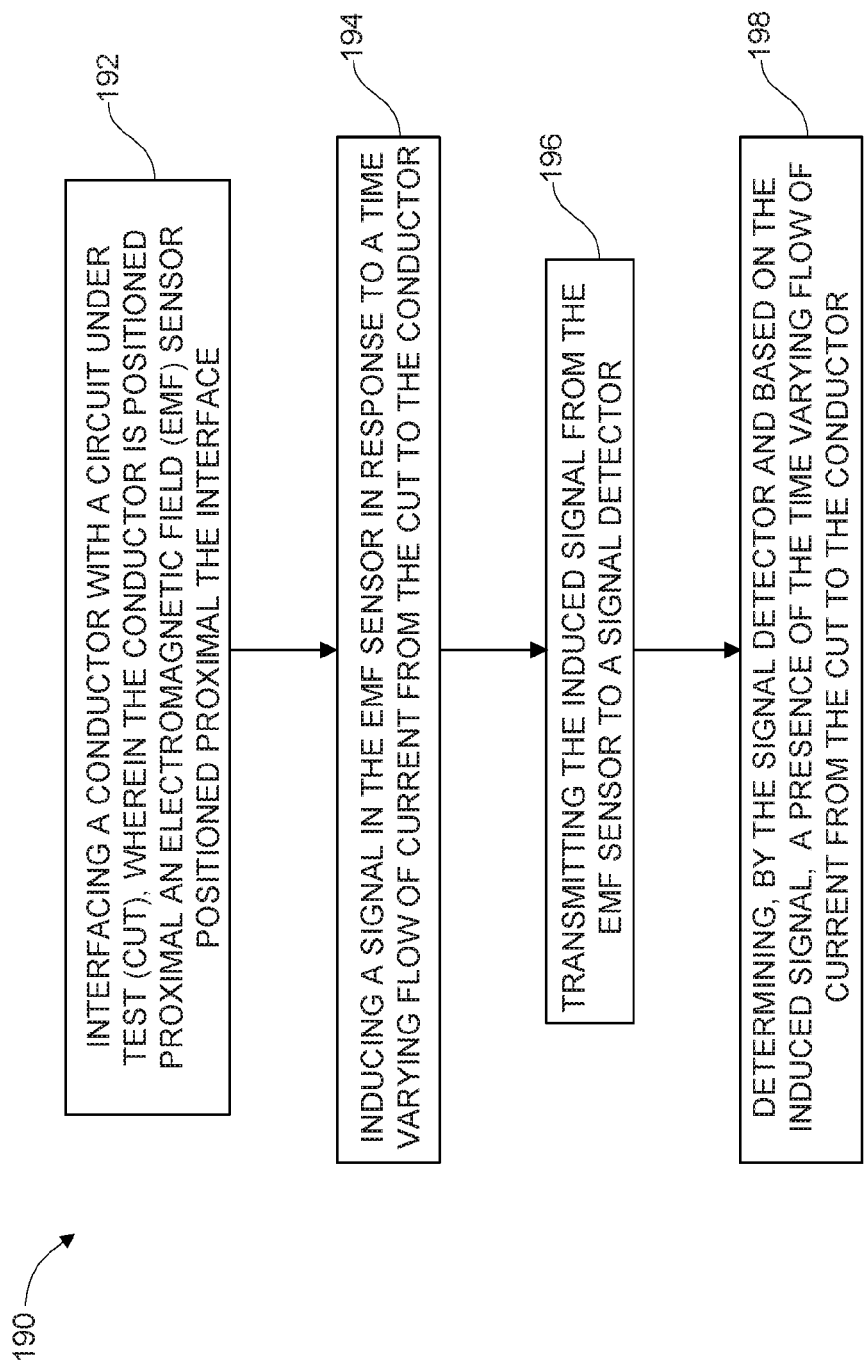
FIG. 2 is a flowchart of a method for testing a circuit according to an embodiment of the disclosure.

FIG. 2 is a flowchart of a method (e.g., a method (190)) for testing a circuit according to an embodiment of the disclosure. In an example, the steps of method (190) shown and described with reference to FIG. 2 are implemented, at least in part, using the circuit test device (100) shown and described above with reference to FIG. 1. In an example, the steps of method (180) shown and described with reference to FIG. 2 are implemented, at least in part, using circuit (104) shown and described above with reference to FIG. 1. Method (190) includes interfacing (192) a conductor (108) with a circuit under test (CUT) (114), where the conductor (108) is positioned proximal an electromagnetic field (EMF) sensor (106). Method (190) includes inducing (194) a signal (116) in the EMF sensor (106) in response to a time varying flow of current (118) from the CUT (114) to the conductor (108). Method (190) includes transmitting (196) the induced signal (116) from the EMF sensor (106) to a signal detector (110). Method (190) includes determining (198), by the signal detector (110) and based on the induced signal (116), a presence of the time varying flow of current (118) from the CUT (114) to the conductor (108).

Figure 3:
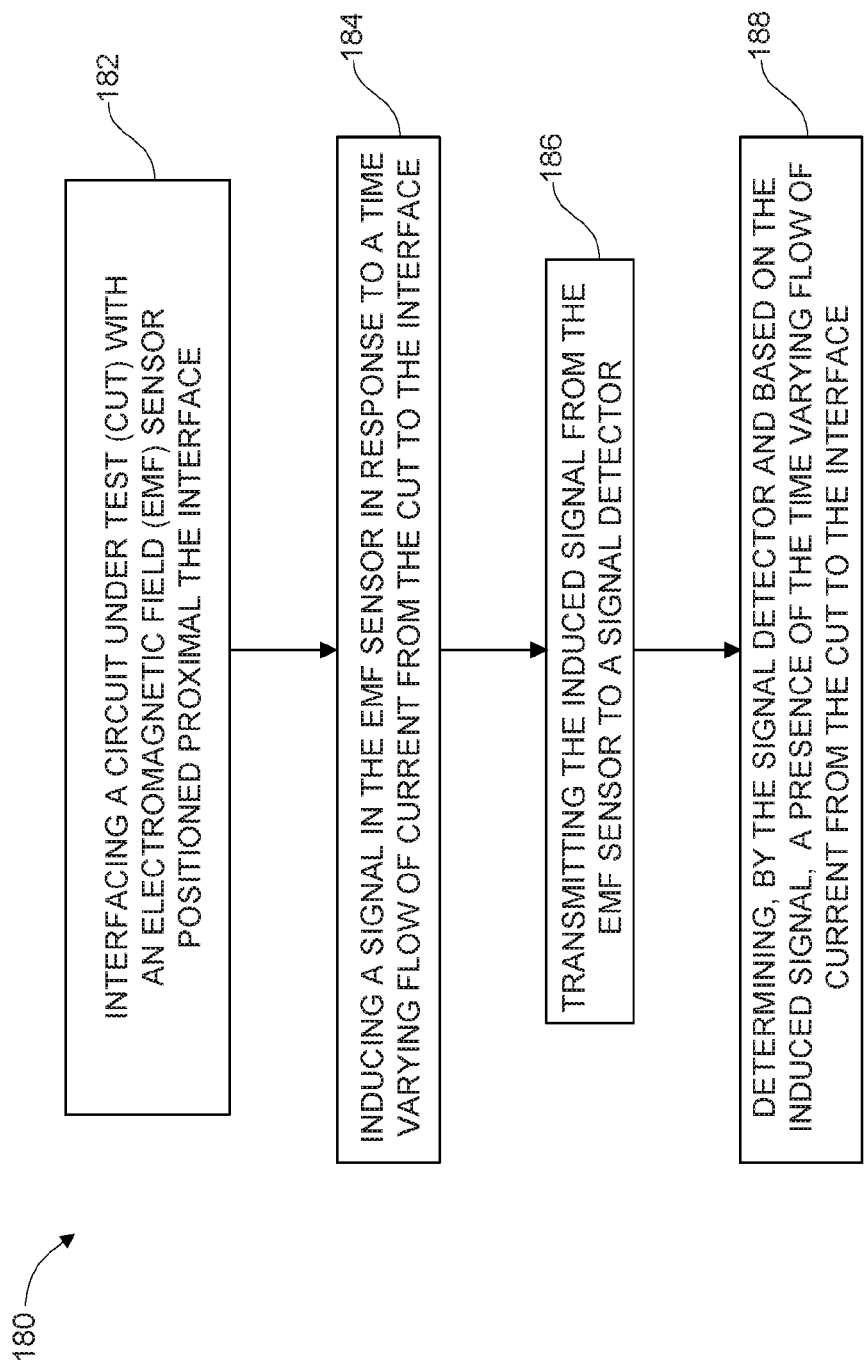
FIG. 3 is a flowchart of a method for testing a circuit according to an embodiment of the disclosure.

FIG. 3 is a flowchart a method (e.g., a method (180)) for testing a circuit according to an embodiment of the disclosure. In an example, the steps of method (180) shown and described with reference to FIG. 3 are implemented, at least in part, using circuit test device (100) shown and described above with reference to FIG. 1. In an example, the steps of method (180) shown and described with reference to FIG. 3 are implemented, at least in part, using circuit (104) shown and described above with reference to FIG. 1. Method (180) includes interfacing (182), by interface (112), a circuit under test (CUT) (114) with electromagnetic field (ENV) sensor (106). The EMF sensor (106) is positioned proximal the interface (112). Method (180) includes inducing (184) a signal (116) in the EMF sensor (106) in response to a time varying flow of current (118) from the CUT (114) to the interface (112). Method (180) includes transmitting (186) the induced signal (116) from the EMF sensor (106) to signal detector (110). Method (180) includes determining (188), by the signal detector (110) and based on the induced signal (116), a presence of the time varying flow of current (118) from the CUT (114) to the interface (112).

The disclosed devices, systems, and methods for testing circuits enable detection of the presence of a hot wire without requiring a ground or neutral. Use of the disclosed circuit test devices, systems, and methods in arc fault circuit interrupt (AFCI) testing devices is exemplified by various disclosures in International Patent Application No. PCT/US2019/015590, which is incorporated by reference herein in its entirety. However, the above-described devices, systems, and methods for testing circuits are equally beneficial and technically applicable for use in voltage (voltmeter), current (ammeter), and circuit test devices generally. For example, and without limitation, the disclosed circuit test devices, systems, and methods may be utilized in and/or incorporated into standard outlet testers, ground fault circuit interrupt (GFCI) outlet testers, circuit breaker finders, and such other circuit test devices where reliably and safely detecting a hot wire without requiring a ground or neutral is beneficial to users.

Aspects of the present disclosure will now be described with reference to the following numbered clauses:
1. A circuit test device, including:
    a housing;
    a circuit disposed in the housing and including:
        an electromagnetic field (EMF) sensor; and
        a signal detector coupled to the EMF sensor; and
    an interface connected to the circuit and extending through the housing, the interface being adapted for coupling the circuit to a circuit under test (CUT), where the EMF sensor is configured to:
        generate a signal in the presence of a time varying flow of current from the CUT in the circuit, and
        provide the signal to the signal detector.
2. The circuit test device of clause 1, further including an indicator coupled to the signal detector, the indicator configured to provide an indication in response to the signal.
3. The circuit test device of any of the preceding clauses, where the indicator includes an illuminator coupled to the signal detector and visible externally from the housing, and where the signal detector is configured to activate the illuminator when the signal is present.
4. The circuit test device of any of the preceding clauses, where the signal includes information indicative of a magnitude of the time varying flow of current, where the illuminator is configured to provide variable illumination selectively in at least one of a brightness, a color, and a blinking frequency, and where the variable illumination depends on the magnitude.
5. The circuit test device of any of the preceding clauses, where the indicator further includes a display coupled to the signal detector and visible externally from the housing, and where the signal detector is configured to change a display configuration of the display in response to the signal.
6. The circuit test device of any of the preceding clauses, where the signal includes information indicative of a magnitude of the time varying flow of current, and where the signal detector is further configured to change a display configuration based on the magnitude.
7. The circuit test device of any of the preceding clauses, where the indicator includes at least one speaker coupled to the signal detector, the speaker operable to generate one or more audible sounds in response to the signal.
8. The circuit test device of any of the preceding clauses, where the signal includes information indicative of a magnitude of the time varying flow of current, where the one or more audible sounds are adjustable by the signal detector and depend on the magnitude.
9. The circuit test device of any of the preceding clauses, further including a power supply disposed in the housing and coupled to the signal detector, the power supply configured to provide power to at least one of the signal detector, the EMF sensor, and the indicator.
10. The circuit test device of any of the preceding clauses, where the power supply includes a battery.
11. The circuit test device of any of the preceding clauses, where the signal detector includes logic circuitry.
12. The circuit test device of any of the preceding clauses, where the signal detector includes at least one of: a processor, a microcontroller, and a memory.
13. The circuit test device of any of the preceding clauses, where the EMF sensor is positioned proximal the interface.
14. The circuit test device of any of clauses 1-13, where the EMF sensor is further positioned in the absence of contact between the interface and the EMF sensor.
15. The circuit test device of any of clauses 1-13, where the EMF sensor is further positioned in contact with at least a portion of the interface.
16. The circuit test device of any of the preceding clauses, further including a conductor disposed in the housing, where:
    the conductor is coupled to the interface;
    the interface is further adapted for coupling the conductor to the CUT; and
    the EMF sensor is further configured to generate the signal in the presence of the time varying flow of current from the CUT in the conductor.
17. The circuit test device of clause 16, where the conductor is positioned proximal the EMF sensor.
18. The circuit test device of any of clauses 16 and 17, where the conductor is further positioned in the absence of contact between the conductor and the EMF sensor.
19. The circuit test device of any of clauses 16 and 17, where the conductor is further positioned in contact with at least a portion of the EMF sensor.

20. The circuit test device of any of the preceding clauses, where the circuit further includes an amplifier coupled to the EMT sensor and coupled to the signal detector, the amplifier configured to amplify the signal.

21. The circuit test device of any of the preceding clauses, where the signal is indicative of a time varying flow of detector current.

22. The circuit test device of any of the preceding clauses, where the circuit further includes a power converter coupled to at least one of: the signal detector, the EMF sensor, the indicator, and the power supply.

23. The circuit test device of any of the preceding clauses, where the power converter is configured to receive at least a portion of the detector current for providing power to at least one of: the signal detector, the EMF sensor, the indicator, and the power supply.

24. The circuit test device of any of the preceding clauses, where the EMF sensor includes an antenna.

25. The circuit test device of any of the preceding clauses, where the antenna includes a conductive pad.

26. The circuit test device of any of the preceding clauses, where the circuit plate includes a printed circuit board.

27. A circuit for testing a circuit under test (CUT), the circuit including:
an electromagnetic field (EMF) sensor;
a signal detector coupled to the EMT sensor; and
an interface adapted for coupling the circuit to a circuit under test (CUT),
where the EMF sensor is configured to:
generate a signal in the presence of a time varying flow of current from the CUT in the circuit, and
provide the signal to the signal detector.

28. The circuit of clause 27, further including a power supply disposed in the housing and coupled to the signal detector, the power supply configured to provide power to at least one of: the signal detector, and the EMF sensor.

29. The circuit of any of the preceding clauses, where the power supply includes a battery.

31. The circuit of any of the preceding clauses, where the signal detector includes logic circuitry.

32. The circuit of any of the preceding clauses, where the signal detector includes at least one of: a processor, a microcontroller, and a memory.

33. The circuit of any of the preceding clauses, where the EMF sensor is positioned proximal the interface.

34. The circuit of any of clauses 27-33, where the EMF sensor is further positioned in the absence of contact between the interface and the EMF sensor.

35. The circuit of any of clauses 27-33, where the EMF sensor is further positioned in contact with at least a portion of the interface.

36. The circuit of any of the preceding clauses, further including a conductor is coupled to the interface, where:
the interface is further adapted for coupling the conductor to the CUT; and
the EMF sensor is further configured to generate the signal in the presence of the time varying flow of current from the CUT in the conductor.

37. The circuit of clause 36, where the conductor is positioned proximal the EMF sensor.

38. The circuit of any of clauses 36 and 37, where the conductor is further positioned in the absence of contact between the conductor and the EMF sensor.

39. The circuit of any of clauses 36 and 37, where the conductor is further positioned in contact with at least a portion of the EMF sensor.

40. The circuit of any of the preceding clauses, further including an amplifier coupled to the EMF sensor and coupled to the signal detector, the amplifier configured to amplify the signal.

41. The circuit of any of the preceding clauses, where the signal is indicative of a time varying flow of detector current.

42. The circuit of any of the preceding clauses, further including a power converter coupled to at least one of: the signal detector, the EMF sensor, and the power supply.

43. The circuit of any of the preceding clauses, where the power converter is configured to receive at least a portion of the detector current for providing power to at least one of: the signal detector, the EMF sensor, and the power supply.

44. The circuit of any of the preceding clauses, where the EMF sensor includes an antenna.

45. The circuit of any of the preceding clauses, where the antenna includes a conductive pad.

46. The circuit of any of the preceding clauses, further including a circuit plate.

47. The circuit of any of the preceding clauses, where the interface extends along the circuit plate.

48. The circuit of any of the preceding clauses, where the conductor extends along the circuit plate.

49. The circuit of any of the preceding clauses, where the circuit plate includes a printed circuit board.

50. The circuit of any of the preceding clauses, further including an indicator coupled to the signal detector, the indicator configured to provide an indication in response to the signal.

51. The circuit of any of the preceding clauses, where the indicator includes an illuminator coupled to the signal detector, and where the signal detector is configured to activate the illuminator when the signal is present.

52. The circuit of any of the preceding clauses, where the signal includes information indicative of a magnitude of the time varying flow of current, where the illuminator is configured to provide variable illumination selectively in at least one of a brightness, a color, and a blinking frequency, and where the variable illumination depends on the magnitude.

53. The circuit of any of the preceding clauses, where the indicator further includes a display coupled to the signal detector, and where the signal detector is configured to change a display configuration of the display in response to the signal.

54. The circuit of any of the preceding clauses, where the signal includes information indicative of a magnitude of the time varying flow of current, and where the signal detector is further configured to change a display configuration based on the magnitude.

55. The circuit of any of the preceding clauses, where the indicator includes at least one speaker coupled to the signal detector, the speaker operable to generate one or more audible sounds in response to the signal.

56. The circuit of any of the preceding clauses, where the signal includes information indicative of a magnitude of the time varying flow of current, and where the one or more audible sounds are adjustable by the signal detector and depend on the magnitude.

57. A method according to a first embodiment for testing a circuit, the method including:
interfacing, by an interface, a circuit under test (CUT) with an electromagnetic field (EMF) sensor positioned proximal the interface;

inducing a signal in the EMT sensor in response to a time varying flow of current from the CUT to the interface;
transmitting the induced signal from the EMF sensor to a signal detector; and
determining, by the signal detector and based on the induced signal, a presence of the time varying flow of current from the CUT to the interface.

58. The method according to the first embodiment of clause 57, implemented using the circuit test device of clause 1.
59. The method according to the first embodiment of clause 57, implemented using the circuit of clause 27.
60. The method according to the first embodiment of clause 58, where the circuit test device includes at least one of: a voltmeter, and an ammeter.
61. The method according to the first embodiment of any of clauses 58 and 60, where the circuit test device includes one or more of: a standard outlet tester, a ground fault circuit interrupt (GFCI) outlet tester, a circuit breaker finder, and an arc fault circuit interrupt (AFCI) tester.
62. The method according to a second embodiment for testing a circuit, the method including:
    interfacing a conductor with a circuit under test (CUT), where the conductor is positioned proximal an electromagnetic field (EMF) sensor;
    inducing a signal in the EMT sensor in response to a time varying flow of current from the CUT to the conductor;
    transmitting the induced signal from the EMF sensor to a signal detector; and
    determining, by the signal detector and based on the induced signal, a presence of the time varying flow of current from the CUT to the conductor.
63. The method according to the second embodiment of clause 62, implemented using the circuit test device of clause 1.
64. The method according to the second embodiment of clause 62, implemented using the circuit of clause 27.
65. The method according to the second embodiment of clause 63, where the circuit test device includes at least one of: a voltmeter, and an ammeter.
66. The method according to the second embodiment of any of clauses 63 and 65, where the circuit test device includes one or more of: a standard outlet tester, a ground fault circuit interrupt (GFCI) outlet tester, a circuit breaker finder, and an arc fault circuit interrupt (AFCI) tester.

Various embodiments disclosed herein are to be taken in the illustrative and explanatory sense, and should in no way be construed as limiting of the present disclosure.

While aspects of the present disclosure have been particularly shown and described with reference to the embodiments above, it will be understood by those skilled in the art that various additional embodiments may be contemplated by the modification of the disclosed machines, systems and methods without departing from the spirit and scope of what is disclosed. Such embodiments should be understood to fall within the scope of the present disclosure as determined based upon the claims and any equivalents thereof.

What is claimed is:

1. A circuit test device, comprising:
   a housing;
   a circuit disposed in the housing and including:
     an electromagnetic field (EMF) sensor; and
     a signal detector coupled to the EMF sensor; and
   an interface connected to the circuit and extending through the housing, the interface being adapted for coupling the circuit to a circuit under test (CUT), and
   a conductor disposed in the housing,
   wherein the EMF sensor is configured to:
     generate a signal in the presence of a time varying flow of current from the CUT in the circuit, and
     provide the signal to the signal detector,
   wherein the conductor is coupled to the interface,
   wherein the interface is further adapted for coupling the conductor to the CUT, and
   wherein the EMF sensor is further configured to generate the signal in the presence of the time varying flow of current from the CUT in the conductor.

2. The circuit test device of claim 1, further comprising an indicator coupled to the signal detector, the indicator configured to provide an indication in response to the signal.
3. The circuit test device of claim 2, wherein the indicator includes an illuminator coupled to the signal detector and visible externally from the housing, and wherein the signal detector is configured to activate the illuminator when the signal is present.
4. The circuit test device of claim 3, wherein the signal includes information indicative of a magnitude of the time varying flow of current, wherein the illuminator is configured to provide variable illumination selectively in at least one of a brightness, a color, and a blinking frequency, and wherein the variable illumination depends on the magnitude.
5. The circuit test device of claim 2, wherein the indicator further comprises a display coupled to the signal detector and visible externally from the housing, and wherein the signal detector is configured to change a display configuration of the display in response to the signal.
6. The circuit test device of claim 5, wherein the signal includes information indicative of a magnitude of the time varying flow of current, and wherein the signal detector is further configured to change a display configuration based on the magnitude.
7. The circuit test device of claim 2, wherein the indicator includes at least one speaker coupled to the signal detector, the speaker operable to generate one or more audible sounds in response to the signal.
8. The circuit test device of claim 7, wherein the signal includes information indicative of a magnitude of the time varying flow of current, and wherein the one or more audible sounds are adjustable by the signal detector and depend on the magnitude.
9. The circuit test device of claim 1, wherein the signal detector includes logic circuitry.
10. The circuit test device of claim 1, wherein the EMF sensor is positioned proximal the interface.
11. The circuit test device of claim 10, wherein the EMF sensor is further positioned in the absence of contact between the interface and the EMF sensor.
12. The circuit test device of claim 1, wherein the EMF sensor is positioned in contact with at least a portion of the interface.
13. The circuit test device of claim 1, wherein the conductor is positioned proximal the EMF sensor.
14. The circuit test device of claim 13, wherein the conductor is further positioned in the absence of contact between the conductor and the EMF sensor.
15. The circuit test device of claim 13, wherein the conductor is further positioned in contact with at least a portion of the EMF sensor.
16. A circuit for testing a circuit under test (CUT), the circuit comprising:
    a circuit plate;
    an electromagnetic field (EMF) sensor disposed on the circuit plate;
    a conductor extending along the circuit plate and positioned proximal the EMF sensor;

a signal detector disposed on the circuit plate and coupled to the EMF sensor; and an interface extending from the circuit plate, the interface adapted for coupling the conductor to the CUT, wherein the EMF sensor is configured to:

generate a signal in the presence of a time varying flow of current from the CUT in the conductor; and provide the signal to the signal detector;

wherein the signal is indicative of a time varying flow of detector current; and wherein the circuit further includes a power converter coupled to the signal detector, the power converter configured to receive at least a portion of the detector current for providing power to the signal detector.

17. The circuit of claim 16, further comprising an amplifier disposed on the circuit plate and coupled to the EMF sensor and to the signal detector, the amplifier configured to amplify the signal.

18. The circuit of claim 16, wherein the EMF sensor includes an antenna.

19. The circuit of claim 18, wherein the antenna includes a conductive pad.

20. The circuit of claim 16, wherein the circuit plate includes a printed circuit board.

* * * * *